United States Patent
Zampardi et al.

(10) Patent No.: US 6,506,659 B2
(45) Date of Patent: Jan. 14, 2003

(54) HIGH PERFORMANCE BIPOLAR TRANSISTOR

(75) Inventors: Peter J. Zampardi, Newbury Park, CA (US); Klaus F. Schuegraf, Aliso Viejo, CA (US); Paul Kempf, Santa Ana, CA (US); Peter Asbeck, San Diego, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/811,321

(22) Filed: Mar. 17, 2001

(65) Prior Publication Data

US 2002/0132435 A1 Sep. 19, 2002

(51) Int. Cl.$^7$ ............................................. H01L 21/331
(52) U.S. Cl. ..................... 438/375; 438/349; 257/197
(58) Field of Search ................................. 438/309, 349, 438/369, 350, 372, 375, 377; 257/197

(56) References Cited

U.S. PATENT DOCUMENTS

| | | | |
|---|---|---|---|
| 5,117,271 A | * | 5/1992 | Comfort et al. ............. 257/198 |
| 6,177,325 B1 | * | 1/2001 | Jang ............................. 438/318 |
| 6,262,472 B1 | * | 7/2001 | Gregory ...................... 257/592 |

OTHER PUBLICATIONS

Wolf, S.; Silicon Processing for the VLSI Era vol. 2: Process Integration, Sunset Beach, CA, 1990, pp. 492–493.*
Okumura, Y., et al: "A Novel Source–to–Drain Nonuniformly Doped Channel (NUDC) MOSFET for High Current Drivability and Threshold Voltage Controllability," IEEE, 1990, pp. 391–394.
Okumura, Y., et al: "Source–to–Drain Nonuniformly Doped Channel (NUDC) MOSFET Structures for High Current Drivability and Threshold Voltage Controllability," IEEE Transactions on Electron Devices, vol. 39, No. 11, Nov. 1992, pp. 2541–2552.
Takashi, H.: "A 0.1–um CMOS Technology with Tilt–Implanted Punchthrough Stopper (TIPS)," IEEE, 1994, pp. 75–78.
Wang, C. H.: "Effect of Narrow–Emitter on Impurity Distribution in Polysilicon Bipolar Transistors," VLSITSA, 1993, pp. 310–314.
Wijnen, P.J., et al: "A Localized Collector Implant to Improve Uniformity of Polysilicon Bilpolar Transistors," IEEE, 1989, pp. 160–163.

* cited by examiner

*Primary Examiner*—John F. Niebling
*Assistant Examiner*—Christopher Lattin
(74) *Attorney, Agent, or Firm*—Farjami & Farjami LLP

(57) ABSTRACT

In one disclosed embodiment, a collector is deposited and a base is grown on the collector, for example, by epitaxially depositing either silicon or silicon-germanium. An emitter is fabricated on the base followed by implant doping an extrinsic base region. For example, the extrinsic base region can be implant doped using boron. The extrinsic base region doping diffuses out during subsequent thermal processing steps in chip fabrication, creating an out diffusion region in the device, which can adversely affect various operating characteristics, such as parasitic capacitance and linearity. The out diffusion is controlled by counter doping the out diffusion region. For example, the counter doped region can be implant doped using arsenic or phosphorous. Also, for example, the counter doped region can be formed using tilt implanting or, alternatively, by implant doping the counter doped region and forming a spacer on the base prior to implanting the extrinsic base region.

32 Claims, 4 Drawing Sheets

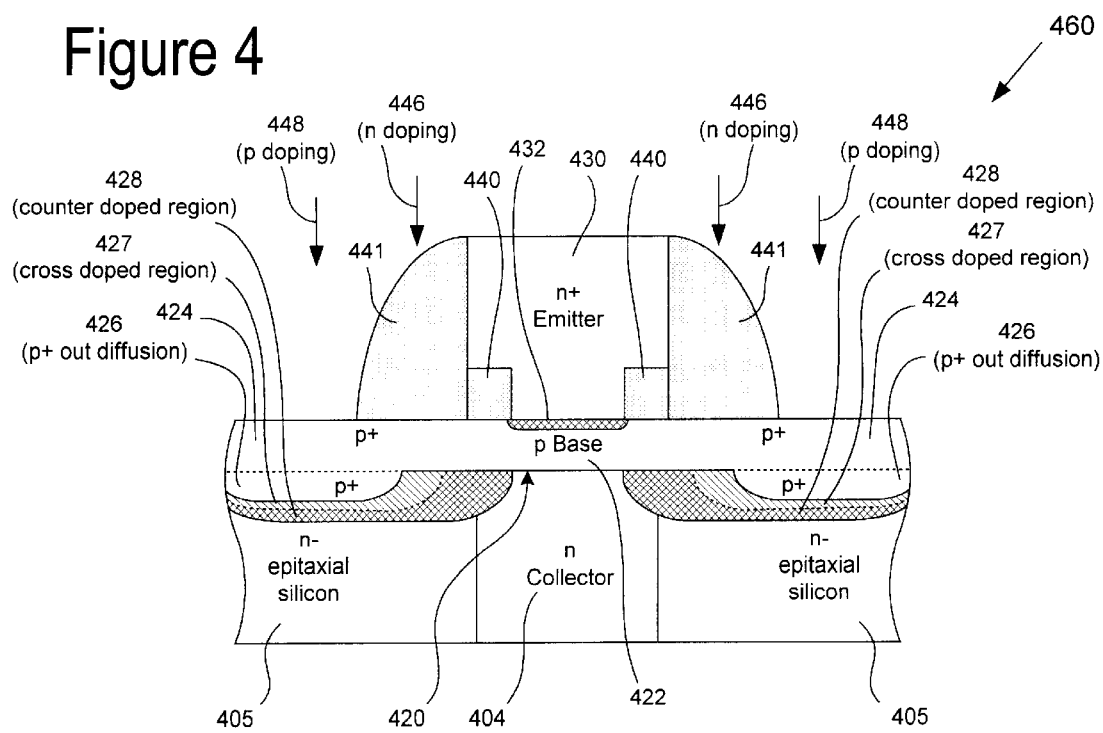

HIGH PERFORMANCE BIPOLAR TRANSISTOR

BACKGROUND OF THE INVENTION

1. Field of the Invention

The present invention relates to the field of fabrication of semiconductor devices. More specifically, the invention relates to the fabrication of silicon-germanium semiconductor devices.

2. Related Art

In a heterojunction bipolar transistor ("HBT"), a thin silicon-germanium layer is grown as the base of a bipolar transistor on a silicon wafer. The silicon-germanium HBT has significant advantages in speed, frequency response, and gain when compared to a conventional silicon bipolar transistor. Speed and frequency response can be compared by the cutoff frequency which, simply stated, is the frequency where the gain of a transistor is drastically reduced. Cutoff frequencies in excess of 100 GHz have been achieved for the HBT, which are comparable to the more expensive GaAs. Previously, silicon-only devices have not been competitive for use where very high speed and frequency response are required.

The higher gain, speeds, and frequency response of the HBT have been achieved as a result of certain advantages of silicon-germanium not available with pure silicon, for example, narrower band gap, and reduced resistivity. In addition, silicon-germanium may be epitaxially grown on silicon wafers using conventional silicon processing and tools, and allows one to engineer device properties such as the band gap, energy band structure, and mobilities. For example, it is known in the art that grading the concentration of germanium in the silicon-germanium base builds into the HBT device an electric field, which accelerates the carriers across the base, thereby increasing the speed of the HBT device compared to a silicon-only device. One method for fabricating silicon and silicon-germanium devices is by chemical vapor deposition ("CVD"). A reduced pressure chemical vapor deposition technique, or RPCVD, used to fabricate the HBT device allows for a controlled grading of germanium concentration across the base layer.

Because the benefits of a high gain and high speed silicon-germanium HBT device can be either partially or completely negated by high base contact resistance, it is important that the resistance of the base contact be kept low. In addition to the contact resistance, the geometry of the base regions may also affect the base resistance. The geometry of the base region may necessitate providing a low resistance electrical pathway through a portion of the base itself between the base contact and the base-emitter junction, referred to as the extrinsic base region. The extrinsic base region is heavily doped by implantation (also called extrinsic doping) in order to provide reduced resistance from the base contact to the base-emitter junction.

During the manufacture of an integrated circuit chip there are many processing steps which involve heating the wafer in which the integrated circuit chip is included. It is normal for dopants to diffuse out from where they have been implanted into surrounding areas of the chip during these heating processes. Typically, the out diffusion of dopants is accounted for in the design of a circuit device such as the HBT. Unwanted out diffusion can have disadvantageous effects, however, especially under certain circumstances. For example, there is drive in current technology to operate the HBT at lower voltages and comparatively higher collector currents for those low voltages. When the HBT is operated in a range of low voltage and high collector current, the effects of an energy barrier at the metallurgical transition from silicon-germanium to silicon near the base-collector junction can become more pronounced. Such an operating range can be characterized, for example, by a collector-emitter voltage in the range of approximately 1.0 to 4.0 volts and a collector current in the range of approximately 0 to 3.0 milliamperes ("mA"). Under these operating conditions, an energy barrier at the metallurgical transition from silicon-germanium to silicon near the base-collector junction has an effect of limiting current flow through the collector.

Out diffusion of dopants from the heavily doped extrinsic base region acts to further restrict collector current flow under these conditions and there are other deleterious effects on the operating characteristics and device parameters of the HBT device. For example, the operating range over which the HBT can operate linearly as class A amplifier is reduced. Briefly stated, a device operates as a class A amplifier if output current flows for all values of the input, as opposed to, for example, class B operation in which output current flows for one-half the cycle of the input waveform. Linear operation, simply stated, is the amplification of an input signal without distortion. A wider operating range for linear class A operation, i.e. one in which the maximum and minimum voltages and currents of the device are spaced further apart, is desirable because design flexibility and reliability are increased. As another example, power output in class A operation can be reduced because the reduced collector current directly reduces power which, simply stated is the product of current times voltage.

As a further example, out diffusion of dopants from the heavily doped extrinsic base region may increase a parasitic capacitance between the base and collector. Briefly, capacitance in an electric circuit relates to an effective flow of current due to the storage of electric charge between two otherwise electrically separated conductors. Parasitic capacitance between the base and collector effectively represents a near-short circuit in the HBT for a high frequency signal being amplified and is, thus, undesirable.

Also, for example, out diffusion of dopants from the heavily doped extrinsic base region can reduce a breakdown voltage of the HBT device. Briefly, the presence of a voltage, greater than the breakdown voltage, between the base region and a conductive region below the collector can cause the intervening material, which physically and electrically separates the two, to start to conduct electricity, known as "breakdown" of the intervening material. When breakdown occurs the HBT device no longer functions as intended, and can be permanently damaged. Thus, it is undesirable for breakdown voltage to be reduced.

Moreover, the effects of out diffusion on a device can limit the scalability of the device. Scalability, simply stated, refers to preserving the relative proportions of the various features of a device in such a way that the device still functions when the overall size of the entire device is reduced. As feature sizes of bipolar devices are reduced, it is important to achieve accurate control over the size of the various features in order to keep feature sizes in proportion. So for example, if out diffusion is not properly controlled the relative size of the out diffusion regions increases as the size of the entire bipolar device is reduced. An increase in the relative size of the out diffusion regions exacerbates the problems and disadvantages described above. Thus, the effects of out diffusion on the device can limit the scalability of the bipolar device. Furthermore, as feature size of CMOS devices is reduced it is important to achieve a concomitant reduction of feature size in bipolar devices on the same chip as CMOS devices.

One approach to the problem has been to use carbon in conjunction with the implant doping of the extrinsic base regions as a "suppressant" to control the amount of subsequent out diffusion of dopants from the extrinsic base regions. In general, the use of carbon for control of diffusion is complicated to implement from a technological viewpoint, is not generally available in the industry, and can require expensive tooling or retooling of the fabrication facility.

Thus, there is a need in the art to control out diffusion of dopants in bipolar devices. There is also need in the art for technologically simple, relatively low cost, readily available control of out diffusion of dopants in bipolar devices. There is a further need in the art for fabrication of bipolar devices which is scalable as the size of MOS and CMOS devices decreases.

SUMMARY OF THE INVENTION

The present invention is directed to a high performance bipolar transistor. The invention is used to control out diffusion of dopants in bipolar devices. The invention overcomes the need in the art for technologically simple, relatively low cost, readily available control of out diffusion of dopants in bipolar devices. The invention also provides fabrication of bipolar devices which is scalable to the size of MOS and CMOS devices as the size of MOS and CMOS devices decreases.

In one aspect of the invention a collector is deposited and a base is grown on the collector. For example, the base can be grown by epitaxially depositing either silicon or silicon-germanium on the collector. An emitter is then fabricated on the base followed by implant doping an extrinsic base region outside the emitter. For example, the extrinsic base region can be implant doped using boron with an implant dose of approximately $10^{15}$ atoms per square centimeter. The extrinsic base region doping diffuses out during subsequent thermal processing steps in chip fabrication, creating an out diffusion region in the device. The out diffusion region can adversely affect various operating characteristics of the device, such as parasitic capacitance and linearity. The out diffusion is controlled by counter doping the out diffusion region. For example, the counter doped region can be implant doped using arsenic or phosphorous with an implant dose of approximately $10^{13}$ atoms per square centimeter. Also, for example, the counter doped region can be formed using tilt implanting or, alternatively, by implant doping the counter doped region and then forming a spacer on the base prior to implanting the extrinsic base region.

BRIEF DESCRIPTION OF THE DRAWINGS

FIG. 4 illustrates a cross sectional view, at a level of detail similar to that of FIG. 3, of some of the features of an NPN HBT fabricated in accordance with another embodiment of the present invention.

DETAILED DESCRIPTION OF THE INVENTION

The present invention is directed to a high performance bipolar transistor. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
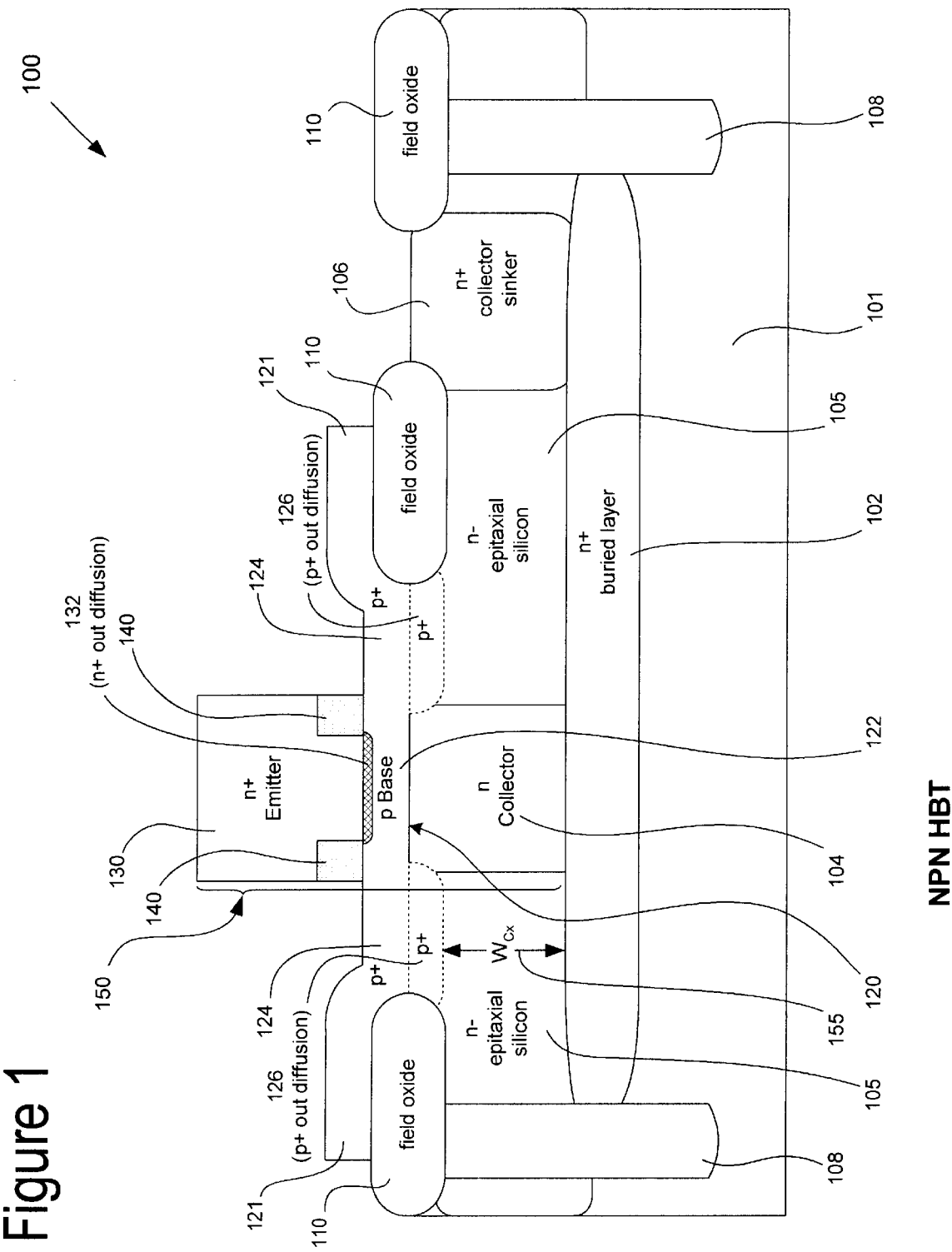
FIG. 1 illustrates a cross sectional view of some of the features of an NPN HBT.

By way of background, FIG. 1 shows a cross sectional view of various features and components of structure 100 which includes various features and components of an NPN heterojunction bipolar transistor ("HBT"). Structure 100 includes collector 104, base 120, and emitter 130. Collector 104 is N type single crystal silicon which can be deposited epitaxially using an RPCVD process in a manner known in the art. Base 120 is P-type silicon-germanium single crystal deposited epitaxially, for example, in a "nonselective" RPCVD process. As seen in FIG. 1, base 120 is situated on top of, and forms a junction with, collector 104. Base contacts 121 are polycrystalline silicon-germanium deposited epitaxially, for example, in a "nonselective" RPCVD process. Emitter 130, which is situated above and forms a junction with base 120, is comprised of N-type polycrystalline silicon. Collector 104, base 120, and emitter 130 thus form a heterojunction bipolar transistor, or HBT, which is generally referred to by numeral 150 in FIG. 1.

As seen in FIG. 1, buried layer 102, which is composed of N+ type material—meaning that it is relatively heavily doped N- type material—is formed in silicon substrate 101 in a manner known in the art. Collector sinker 106, also composed of N+ type material, is formed by diffusion of heavily concentrated dopants in N- type epitaxial silicon 105 from the surface of collector sinker 106 down to buried layer 102. Buried layer 102, along with collector sinker 106, provide a low resistance electrical pathway from collector 104 through buried layer 102 and collector sinker 106 to a collector contact (the collector contact is not shown in any of the Figures). Deep trench 108 and field oxide 110 isolation structures composed of silicon oxide ($SiO_2$) material are formed in a manner known in the art. Deep trench 108 and field oxide 110 isolation structures provide electrical isolation from other devices on silicon substrate 101 in a manner known in the art.

Also as seen in FIG. 1, emitter 130 also comprises "out-diffusion region" 132 formed by the out-diffusion of N+ dopants from the polycrystalline silicon of emitter 130 into the single crystal layer below emitter 130. As seen in FIG. 1, polycrystalline silicon emitter 130 is situated above N+ out-diffusion region 132. Dielectric segments 140, which can be composed of silicon oxide, provide electrical isolation to emitter 130 from base 120.

Base 120 includes intrinsic base region 122. Single crystal N+ out-diffusion region 132 is situated above single crystal intrinsic base region 122. The base-emitter junction is formed within the single crystal layer at the boundary of N+ out-diffusion region 132 and intrinsic base region 122. Intrinsic base region 122 and base contacts 121 are electrically connected with each other through extrinsic base regions 124. Extrinsic base regions 124 and intrinsic base region 122 comprise base 120.

Continuing with FIG. 1, N+ out-diffusion region 132 in the single crystal layer is formed by out-diffusion of heavy concentration of N type—for example, arsenic—dopants after ion implantation doping of polycrystalline silicon emitter 130. The N+ doping renders emitter 130 an N− type emitter. Ion implantation of extrinsic base regions 124 has resulted in the heavily doped P+ implanted extrinsic base regions 124. In one embodiment, the dopant used to form implanted extrinsic base regions 124 can be boron. The heavy doping in implanted extrinsic base regions 124 lowers the overall resistance of extrinsic base regions 124. The overall base resistance of HBT 150 is thereby improved by lowering the contribution of extrinsic base regions 124 to the series resistance of the path from the base contacts, through the heavily doped extrinsic base regions 124 to intrinsic base region 122. Out diffusion from heavily doped P+ implanted extrinsic base regions 124 into N− epitaxial silicon 105 forms P+ out diffusion regions 126.

As seen in FIG. 1, P+ out diffusion regions 126 surround collector 104, degrading the performance of HBT 150 under certain conditions, as described above. For example, P+ out diffusion regions 126 effectively decrease distance $W_{Cx}$ 155, which is the distance from the highly conductive region of buried layer 102 to the highly conductive region of extrinsic base regions 124. Decreasing distance $W_{Cx}$ 155 tends to increase base-collector parasitic capacitance and decrease breakdown voltage of HBT 150, as described above. Thus, FIG. 1 illustrates an example of the some of the effects of dopant out diffusion on a silicon-germanium HBT.

Figure 2:
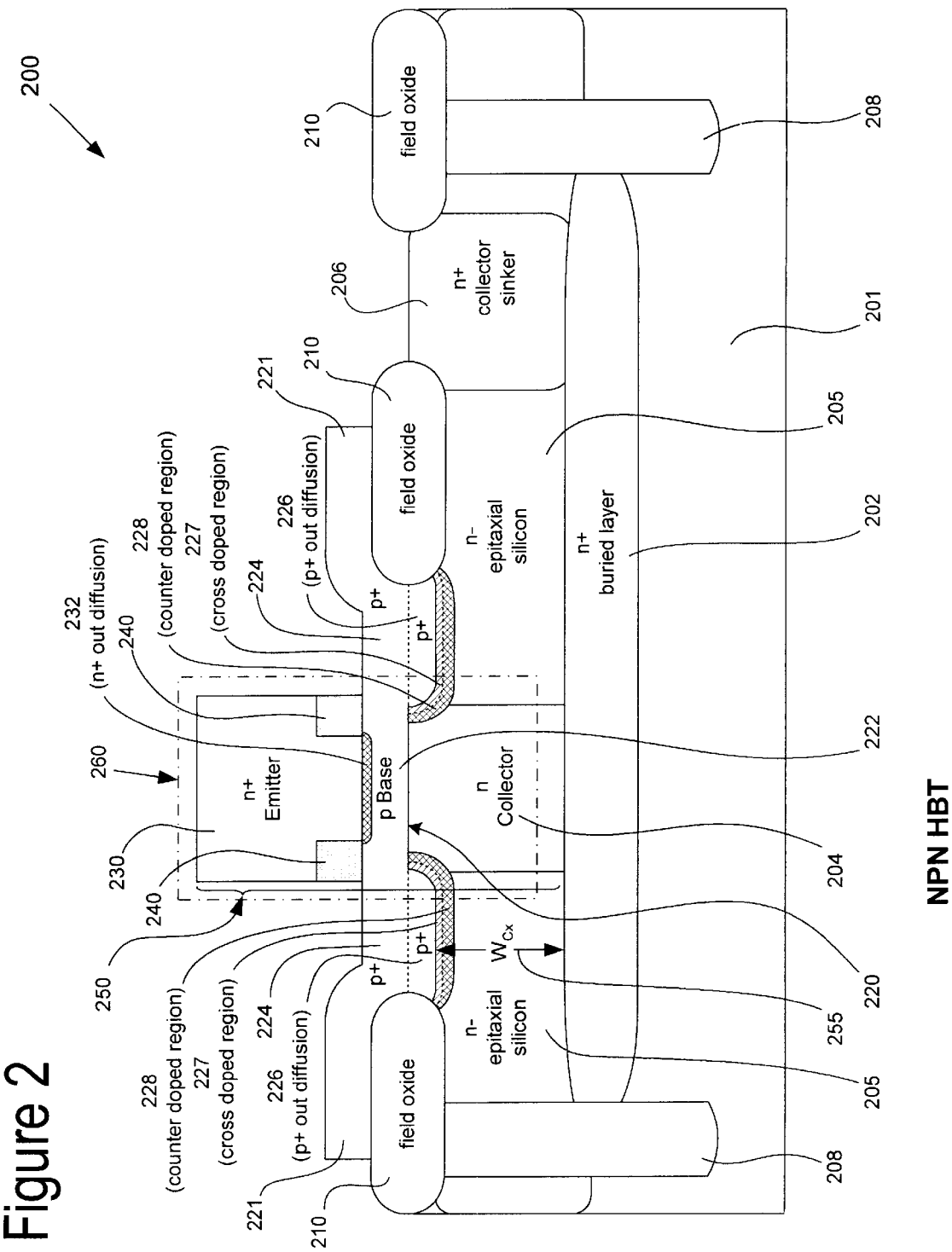
FIG. 2 illustrates a cross sectional view of some of the features of an NPN HBT fabricated in accordance with one embodiment of the present invention.

FIG. 2 shows a cross sectional view of various features and components of structure 200 which includes various features and components of an NPN HBT fabricated in accordance with one embodiment. Structure 200 includes features and components which are analogous in form and function to corresponding features and components of structure 100 in FIG. 1. The corresponding features and components are numbered in a manner consistent with FIG. 1. In particular, portions of selected features and components of structure 100 of FIG. 1 corresponding to collector 104, base 120, and emitter 130 are shown, respectively, as collector 204, base 220, and emitter 230.

In addition, silicon substrate 101, buried layer 102, epitaxial silicon 105, collector sinker 106, deep trench 108 and field oxide 110 isolation structures, base contacts 121, intrinsic base region 122, extrinsic base regions 124, out diffusion regions 126, out-diffusion region 132, dielectric segments 140, and distance $W_{Cx}$ 155 are shown, respectively, as silicon substrate 201, buried layer 202, epitaxial silicon 205, collector sinker 206, deep trench 208 and field oxide 210 isolation structures, base contacts 221, intrinsic base region 222, extrinsic base regions 224, out diffusion regions 226, out-diffusion region 232, dielectric segments 240, and distance $W_{Cx}$ 255. Thus, collector 204, base 220, and emitter 230 form NPN HBT 250 which is analogous to NPN HBT 150 in FIG. 1. The region enclosed by dashed line 260 corresponds to structures 360 of FIG. 3 and 460 of FIG. 4, which show the area enclosed by dashed line 160 in greater detail.

Structure 200 includes collector 204, base 220, and emitter 230. Collector 204 is N type single crystal silicon which can be deposited epitaxially using an RPCVD process in a manner known in the art. Base 220 is P− type silicon-germanium single crystal which can be deposited epitaxially in a "nonselective" RPCVD process according to one embodiment. As seen in FIG. 2, base 220 is situated on top of, and forms a junction with, collector 204. Base contacts 221 are polycrystalline silicon-germanium which can be deposited epitaxially in a "nonselective" RPCVD process according to one embodiment. Emitter 230, which is situated above and forms a junction with base 220, is comprised of N− type polycrystalline silicon. Collector 204, base 220, and emitter 230 form NPN HBT 250 analogous to NPN HBT 150 in FIG. 1.

As seen in FIG. 2, buried layer 202, composed of N+ type material, is formed in silicon substrate 201. Collector sinker 206, also composed of N+ type material, is formed by diffusion of heavily concentrated dopants in N− type epitaxial silicon 205 from the surface of collector sinker 206 down to buried layer 202. Buried layer 202, along with collector sinker 206, provide a low resistance electrical pathway from collector 204 through buried layer 202 and collector sinker 206 to a collector contact (the collector contact is not shown in any of the Figures). Deep trench 208 and field oxide 210 isolation structures composed of silicon oxide, which can be formed in a manner known in the art, provide electrical isolation from other devices on silicon substrate 201, as known in the art. Also, emitter 230 comprises out-diffusion region 232 formed by the out-diffusion of N+ dopants from the polycrystalline silicon of emitter 230 into the single crystal layer below emitter 230. Emitter 230 is situated above N+ out-diffusion region 232. Dielectric segments 240, which can be composed of silicon oxide, provide electrical isolation to emitter 230 from base 220. Base 220 includes intrinsic base region 222. Single crystal N+ out-diffusion region 232 is situated above single crystal intrinsic base region 222. The base-emitter junction is formed within the single crystal layer at the boundary of N+ out-diffusion region 232 and intrinsic base region 222. Intrinsic base region 222 and base contacts 221 are electrically connected with each other through extrinsic base regions 224. Extrinsic base regions 224 and intrinsic base region 222 comprise base 220.

Continuing with FIG. 2, N+ out-diffusion region 232 in the single crystal layer is formed by out-diffusion of heavy concentration of N type—for example, arsenic—dopants after ion implantation doping of polycrystalline silicon emitter 230. The N+ doping renders emitter 230 an N− type emitter. Ion implantation of extrinsic base regions 224 has resulted in the heavily doped P+ implanted extrinsic base regions 224. In one embodiment, the dopant used to form implanted extrinsic base regions 224 can be boron. The heavy doping in implanted extrinsic base regions 224 lowers the overall resistance of extrinsic base regions 224. The overall base resistance of HBT 250 is thereby improved by lowering the contribution of extrinsic base regions 224 to the series resistance of the path from the base contacts, through the heavily doped extrinsic base regions 224 to intrinsic base region 222. Out diffusion from heavily doped P+ implanted extrinsic base regions 224 into N− epitaxial silicon 205 forms P+ out diffusion regions 226.

As seen in FIG. 2, P+ out diffusion regions 226 surround collector 204, degrading the performance of HBT 250 under certain conditions, as described above. For example, P+ out diffusion regions 226 can effectively decrease distance $W_{Cx}$ 255, which is the distance from the highly conductive region of buried layer 202 to the highly conductive region of extrinsic base regions 224. Decreasing distance $W_{Cx}$ 255 tends to increase base-collector parasitic capacitance and decrease breakdown voltage of HBT 250, as described above. Effects of dopant out diffusion can be suppressed or counteracted by forming counter-doped regions 228. When HBT 250 is viewed as a 3-dimensional device, counter-doped regions 228 form a single connected region in the form of a halo around collector 204, thus the process of forming counter-doped regions 228 is also referred to as "halo" doping.

The process of counter doping is known as applied in the fabrication of metal oxide semiconductor ("MOS") and complementary metal oxide semiconductor ("CMOS") devices such as field effect transistors ("FET"). For example, an application of counter doping to FET devices using tilt implant doping is described in "A 0.1-$\mu$m CMOS Technology with Tilt Implanted Punchthrough Stopper (TIPS)" by Takahashi HORI, in *IEDM* 94, pp 75–78, copy right 1994 by the Institute for Electrical and Electronics Engineers ("IEEE"). As another example, an application of counter doping to FET devices is described in "Source-to-Drain Nonuniformly Doped Channel (NUDC) MOSFET Structures for High Current Drivability and Threshold Voltage Controllability" by Yoshinori Okumura, et al., IEEE Transactions on Electron Devices, vol. 39, no. 11, pp 2541–52, November 1992. Counter doping in FET devices, as described in the two examples cited, is used for entirely different reasons compared to the reasons for its application in the present invention as described herein. Moreover, the results of counter doping in FET devices, such as described in the two cited examples, are entirely different from the results achieved by the invention as described in the present application.

Continuing with FIG. 2, counter-doped regions 228 composed of N+ type material can be formed, for example, by implant doping of arsenic or phosphorous. The overlapping concentrations of N type dopants from counter-doped regions 228 with the concentrations of P type dopants from out diffusion regions 226 forms cross doped regions 227. Thus, gradients are formed in the concentration of dopants. In other words, the concentration of dopants varies within out diffusion regions 226, cross doped regions 227, and counter-doped regions 228. For example, the concentration of (P type) boron in out diffusion regions 226 and cross doped regions 227, in one embodiment, can be approximately $10^{20}$ atoms per cubic centimeter, which can be produced using an implant dose of approximately $10^{15}$ atoms per square centimeter. The concentration of (N type) arsenic or phosphorous in cross doped regions 227 and counter-doped regions 228, for example, can range from approximately $5*10^{17}$ to approximately $10^{19}$ atoms per cubic centimeter, which can be produced using an implant dose of approximately $10^{13}$ atoms per square centimeter. Also, for example, the concentration of N type dopants can form a gradient from the relatively high concentrations of approximately $10^{19}$ atoms per cubic centimeter in counter-doped regions 228 to a lower concentration of approximately $10^{18}$ atoms per cubic centimeter in collector 204, to a lower concentration of approximately $10^{16}$ atoms per cubic centimeter in epitaxial silicon 205. Thus, out diffusion regions 226, cross doped regions 227, and counter-doped regions 228 are well-defined but without sharp boundaries. Thus, FIG. 2 illustrates an example of counter doping to suppress out diffusion of dopants and counteract degrading effects of dopant out diffusion on the operating characteristics of a silicon-germanium HBT.

Figure 3:
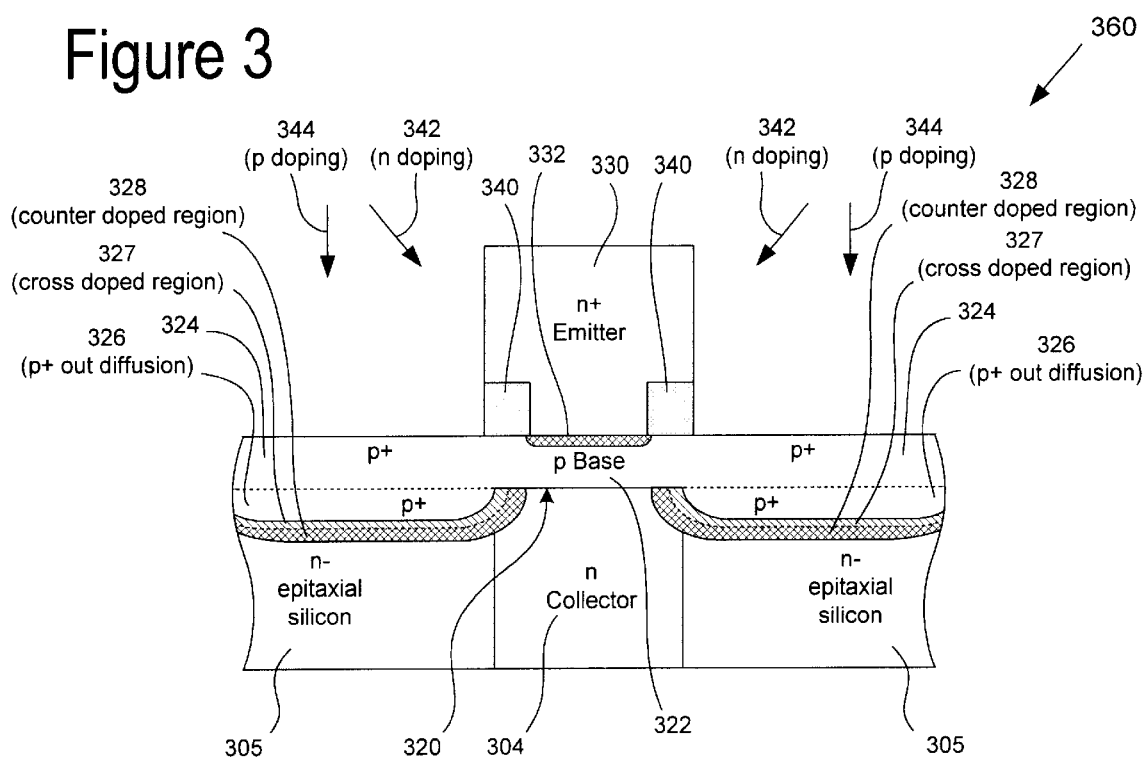
FIG. 3 illustrates in greater detail a portion of the cross sectional view of FIG. 2, and shows a cross sectional view of some of the features of an NPN HBT fabricated in accordance with one embodiment of the present invention.

FIG. 3 shows a more detailed cross sectional view of selected features and components of structure 200 of FIG. 2. FIG. 3 shows structure 360 comprising a region of NPN HBT 250 fabricated in accordance with one embodiment that corresponds to the region of NPN HBT 250 enclosed by dashed line 260 of FIG. 2. Structure 360 includes features and components which are analogous in form and function to corresponding features and components of structure 200 in FIG. 2. The corresponding features and components are numbered in a manner consistent with FIG. 2. In particular, portions of selected features and components of structure 200 of FIG. 2 corresponding to emitter 230, dielectric segments 240, out-diffusion region 232, base 220 including intrinsic base region 222 and extrinsic base regions 224, collector 204, epitaxial silicon 205, out diffusion regions 226, cross doped regions 227, and counter-doped regions 228 enclosed by dashed line 260 in FIG. 2 are shown, respectively, as emitter 330, dielectric segments 340, out-diffusion region 332, base 320 including intrinsic base region 322 and extrinsic base regions 324, collector 304, epitaxial silicon 305, out diffusion regions 326, cross doped regions 327, and counter-doped regions 328 in structure 360 in FIG. 3.

As FIG. 3 shows, in one embodiment, extrinsic base regions 324 can be P type doped using implant doping. The implanting can be applied at an angle, also referred to as "tilt implanting" or "angle implanting" or applied in a non-angled manner, i.e. conventionally. In one embodiment, extrinsic base regions 324 can be conventionally implant doped by performing P type implant doping 344, represented by non-angled arrows 344 in FIG. 3. For example, extrinsic base regions 324 can be implant doped using conventional implanting with boron, using an implant dose of approximately $10^{15}$ atoms per square centimeter, to produce P+ doped extrinsic base regions 324 with a dopant concentration of approximately $10^{20}$ atoms per cubic centimeter, as noted above in connection with FIG. 2. P type implant doping 344 can be either followed or preceded by N type implant doping of counter-doped regions 328. N type counter-doped regions 328 can be formed using tilt implanting 342, represented by angled arrows 342 in FIG. 3. For example, counter-doped regions 328 can be implant doped using tilt implanting 342 with arsenic or phosphorous, using an implant dose of approximately $10^{13}$ atoms per square centimeter, to produce N+ doped counter-doped regions 328 with a dopant concentration in the range of approximately $5*10^{17}$ to approximately $10^{19}$ atoms per cubic centimeter, as noted above in connection with FIG. 2.

Thus, FIG. 3 illustrates an example, using tilt implanting, of implementing counter doping to suppress out diffusion of dopants and counteract degrading effects of dopant out diffusion on the operating characteristics of a silicon-germanium HBT by sequentially implant doping N and P type dopants.

FIG. 4 shows a more detailed cross sectional view of selected features and components of structure 200 of FIG. 2. FIG. 4 shows structure 460 comprising a region of NPN HBT 250 fabricated in accordance with one embodiment that corresponds to the region of NPN HBT 250 enclosed by dashed line 260 of FIG. 2. Structure 460 includes features and components which are analogous in form and function to corresponding features and components of structure 200 in FIG. 2. The corresponding features and components are numbered in a manner consistent with FIG. 2. In particular, portions of selected features and components of structure 200 of FIG. 2 corresponding to emitter 230, dielectric segments 240, out-diffusion region 232, base 220 including intrinsic base region 222 and extrinsic base regions 224, collector 204, epitaxial silicon 205, out diffusion regions 226, cross doped regions 227, and counter-doped regions 228 enclosed by dashed line 260 in FIG. 2 are shown, respectively, as emitter 430, dielectric segments 440, out-diffusion region 432, base 420 including intrinsic base region 422 and extrinsic base regions 424, collector 404, epitaxial silicon 405, out diffusion regions 426, cross doped regions 427, and counter-doped regions 428 in structure 460 in FIG. 4.

As FIG. 4 shows, in one embodiment, N type counter-doped regions 428 can be formed using conventional, i.e. non-angled, implant doping. Counter-doped regions 428 can be formed using N type implant doping 446, represented by non-angled arrows in FIG. 4. For example, counter-doped regions 428 can be implant doped with arsenic or phosphorous, using an implant dose of approximately $10^{13}$ atoms per square centimeter, to produce N+ doped counter-doped regions 428 with a dopant concentration in the range of approximately $5*10^{17}$ to approximately $10^{19}$ atoms per cubic centimeter, as noted above in connection with FIG. 2.

Implant doping 446 is followed by the formation of spacers 441. Spacers 441 can be formed, for example, by depositing a conformal layer of dielectric, such as silicon oxide, over emitter 430 and then etching back the conformal layer. Formation of spacers 441 is followed by P type doping 448 of extrinsic base regions 424 using conventional, i.e. non-angled, implanting. In one embodiment, extrinsic base regions 424 can be conventionally implant doped using P type doping 448, represented by non-angled arrows in FIG. 4. For example, extrinsic base regions 424 can be implant doped using non-angled implanting with boron, using an implant dose of approximately $10^{15}$ atoms per square centimeter, to produce P+ doped extrinsic base regions 424 with a dopant concentration of approximately $10^{20}$ atoms per cubic centimeter, as noted above in connection with FIG. 2.

Thus, FIG. 4 illustrates an example, using conventional implanting, of implementing counter doping to suppress out diffusion of dopants and counteract degrading effects of dopant out diffusion on the operating characteristics of a silicon-germanium HBT by sequentially implant doping N and P type dopants.

It is appreciated by the above detailed description that the invention provides a method for controlling out diffusion of dopants in the fabrication of bipolar transistors. The method eliminates problems associated with out diffusion of dopants from the heavily doped extrinsic base regions near the base-collector junction of a bipolar transistor. Using the invention, out diffusion of dopants can be controlled to improve the linearity, power output, base-collector parasitic capacitance and breakdown voltage of an HBT or conventional bipolar transistor. Further, using the invention, the scalability of the HBT can be improved where reduced feature size is needed. Although the invention is described as applied to the construction of a heterojunction bipolar transistor, it will be readily apparent to a person of ordinary skill in the art how to apply the invention in similar situations where control of dopant out diffusion for improved operating characteristics of a bipolar device is needed.

From the above description of the invention it is manifest that various techniques can be used for implementing the concepts of the present invention without departing from its scope. For example, although the particular embodiment of the present invention described here is applied to silicon-germanium bipolar HBT device, the invention is also applicable, for example, to silicon or silicon-germanium bipolar or BiCMOS devices. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a high performance bipolar transistor has been described.

What is claimed is:

1. A method comprising steps of:

depositing a collector;

growing a base on said collector;

fabricating an emitter on said base;

implant doping an extrinsic base region in said base with a first dopant so as to create an out diffusion region; and counter doping said out diffusion region with a second dopant.

2. The method of claim 1 wherein said growing step comprises epitaxially depositing silicon on said collector.

3. The method of claim 1 wherein said growing step comprises epitaxially depositing silicon-germanium on said collector.

4. The method of claim 1 wherein said step of implant doping said extrinsic base region comprises tilt implanting.

5. The method of claim 1 wherein said step of counter doping said out diffusion region comprises tilt implanting.

6. The method of claim 1 wherein said step of implant doping said extrinsic base region comprises boron implanting.

7. The method of claim 1 wherein said step of counter doping said out diffusion region comprises arsenic implanting.

8. The method of claim 1 wherein said step of counter doping said out diffusion region comprises phosphorous implanting.

9. The method of claim 1 wherein said step of implant doping said extrinsic base region comprises P type implanting using an implant dose of approximately $10^{15}$ atoms per square centimeter.

10. The method of claim 1 wherein said step of counter doping said out diffusion region comprises N type implanting using an implant dose of approximately $10^{13}$ atoms per square centimeter.

11. A method comprising steps of:

depositing a collector;

growing a base on said collector;

fabricating an emitter on said base;

counter doping an out diffusion region with a first dopant;

forming a spacer on said base; and implant doping an extrinsic base region in said base with a second dopant, said second dopant diffusing into said out diffusion region.

12. The method of claim 11 wherein said growing step comprises epitaxially depositing silicon on said collector.

13. The method of claim 11 wherein said growing step comprises epitaxially depositing silicon-germanium on said collector.

14. The method of claim 11 wherein said step of counter doping said out diffusion region comprises implant doping.

15. The method of claim 11 wherein said step of counter doping said out diffusion region comprises arsenic implanting.

16. The method of claim 11 wherein said step of counter doping said out diffusion region comprises phosphorous implanting.

17. The method of claim 1 wherein said step of counter doping said out diffusion region comprises N type implanting using an implant dose of approximately $10^{13}$ atoms per square centimeter.

18. The method of claim 11 wherein said forming step comprises:

depositing a conformal layer of a dielectric on said base;

etching back said conformal layer of said dielectric so as to form said spacer on said base.

19. The method of claim 11 wherein said spacer comprises silicon oxide.

20. The method of claim 11 wherein said implant doping of said extrinsic base region comprises boron implanting.

21. The method of claim 11 wherein said implant doping of said extrinsic base region comprises P type implanting using an implant dose of approximately $10^{15}$ atoms per square centimeter.

22. A structure comprising:

a collector comprising a single crystal silicon;

a base comprising a single crystal material, said base and said collector forming a base-collector junction;

an emitter comprising polycrystalline silicon, said emitter and said base forming a base-emitter junction in an intrinsic base region;

an out diffusion region below an extrinsic base region; and a counter doped region below said out diffusion region.

23. The structure of claim 22 wherein said base comprises silicon-germanium.

24. The structure of claim 22 wherein said base comprises silicon.

25. The structure of claim 22 wherein said counter doped region is implant doped.

26. The structure of claim 22 wherein said counter doped region is arsenic doped.

27. The structure of claim 22 wherein said counter doped region is phosphorous doped.

28. The structure of claim 22 wherein said counter doped region is N type implant doped using an implant dose of approximately $10^{13}$ atoms per square centimeter.

29. The structure of claim 22 wherein said extrinsic base region is boron doped.

30. The structure of claim 22 wherein said extrinsic base region is P type implant doped using an implant dose of approximately $10^{15}$ atoms per square centimeter.

31. The structure of claim 22 further comprising a spacer on said base.

32. The structure of claim 22 wherein said spacer comprises silicon oxide formed by depositing a conformal layer of said silicon oxide and etching back said conformal layer.

* * * * *